US009612648B2

(12) United States Patent
Chun et al.

(10) Patent No.: US 9,612,648 B2
(45) Date of Patent: Apr. 4, 2017

(54) SYSTEM AND METHOD FOR MEMORY CHANNEL INTERLEAVING WITH SELECTIVE POWER OR PERFORMANCE OPTIMIZATION (71) Applicant: Qualcomm Incorporated, San Diego, CA (US)

(72) Inventors: Dexter Chun, San Diego, CA (US); Yanru Li, San Diego, CA (US); Alex Tu, San Diego, CA (US); Haw-Jing Lo, San Diego, CA (US)

(73) Assignee: QUALCOMM INCORPORATED, San Diego, CA (US)

( * ) Notice: Subject to any disclaimer, the term of this patent is extended or adjusted under 35 U.S.C. 154(b) by 264 days.

(21) Appl. No.: 13/962,746

(22) Filed: Aug. 8, 2013

(65) Prior Publication Data

US 2015/0046732 A1 Feb. 12, 2015

(51) Int. Cl.
*G06F 12/00* (2006.01)
*G06F 1/32* (2006.01)
*G06F 12/06* (2006.01)
*G11C 14/00* (2006.01)

(52) U.S. Cl.
CPC ........ *G06F 1/3275* (2013.01); *G06F 12/0607* (2013.01); *G11C 14/0009* (2013.01); *G06F 2212/1028* (2013.01)

(58) Field of Classification Search
None
See application file for complete search history.

(56) References Cited

U.S. PATENT DOCUMENTS

| 6,553,478 | B1 | 4/2003 | Grossier |
| 8,010,764 | B2 | 8/2011 | Keller, Jr. |
| 8,245,060 | B2 | 8/2012 | Worthington |
| 8,321,703 | B2 | 11/2012 | Berard |
| 2007/0180203 | A1* | 8/2007 | Ramgarajan et al. ........ 711/157 |
| 2009/0019243 | A1* | 1/2009 | Hur et al. ..................... 711/158 |
| 2009/0089531 | A1* | 4/2009 | Johnson et al. .............. 711/170 |
| 2010/0228923 | A1 | 9/2010 | Lim |
| 2011/0320751 | A1 | 12/2011 | Wang et al. |
| 2012/0011327 | A1* | 1/2012 | Sun ............................... 711/154 |
| 2012/0144144 | A1 | 6/2012 | Worthington |

(Continued)

OTHER PUBLICATIONS

International Search Report and Written Opinion—PCT/US2014/50208—ISA/EPO—Nov. 10, 2014.

*Primary Examiner* — Baboucarr Faal
(74) *Attorney, Agent, or Firm* — Smith Tempel (57) ABSTRACT Systems and methods are disclosed for providing memory channel interleaving with selective power or performance optimization. One such method involves configuring a memory address map for two or more memory devices accessed via two or more respective memory channels with an interleaved region and a linear region. The interleaved region comprises an interleaved address space for relatively higher performance use cases. The linear region comprises a linear address space for relatively lower power use cases. Memory requests are received from one or more clients. The memory requests comprise a preference for power savings or performance. Received memory requests are assigned to the linear region or the interleaved region according to the preference for power savings or performance.

40 Claims, 7 Drawing Sheets

(56) References Cited

U.S. PATENT DOCUMENTS

| | | | |
|---|---|---|---|
| 2012/0179883 A1* | 7/2012 | Ma | G06F 13/16 |
| | | | 711/157 |
| 2013/0124815 A1* | 5/2013 | Aho et al. | 711/170 |
| 2013/0268984 A1* | 10/2013 | Salinger et al. | 725/109 |
| 2013/0339640 A1* | 12/2013 | Cho | 711/157 |
| 2014/0025867 A1* | 1/2014 | Nishimori et al. | 711/103 |
| 2014/0040576 A1* | 2/2014 | Cordero et al. | 711/162 |
| 2014/0164720 A1* | 6/2014 | Stewart | G06F 12/0607 |
| | | | 711/157 |
| 2014/0310503 A1* | 10/2014 | Avoinne et al. | 711/211 |
| 2014/0344227 A1* | 11/2014 | Grube et al. | 707/691 |

* cited by examiner

SYSTEM AND METHOD FOR MEMORY CHANNEL INTERLEAVING WITH SELECTIVE POWER OR PERFORMANCE OPTIMIZATION

DESCRIPTION OF THE RELATED ART

Many computing devices, including portable computing devices such as mobile phones, include a System on Chip ("SoC"). SoCs are demanding increasing power performance and capacity from memory devices, such as, double data rate (DDR) memory devices. These demands lead to both faster clock speeds and wide busses, which are then typically partitioned into multiple, narrower memory channels in order to remain efficient. Multiple memory channels may be address-interleaved together to uniformly distribute the memory traffic across memory devices and optimize performance. Memory data is uniformly distributed by assigning addresses to alternating memory channels. This technique is commonly referred to as symmetric channel interleaving.

Existing symmetric memory channel interleaving techniques require all of the channels to be activated. For high performance use cases, this is intentional and necessary to achieve the desired level of performance. For low performance use cases, however, this leads to wasted power and inefficiency. Accordingly, there remains a need in the art for improved systems and methods for providing memory channel interleaving.

SUMMARY OF THE DISCLOSURE

Systems and methods are disclosed for providing memory channel interleaving with selective power or performance optimization. One embodiment is a memory channel interleaving method with selective power or performance optimization. One such method comprises: configuring a memory address map for two or more memory devices accessed via two or more respective memory channels with an interleaved region and a linear region, the interleaved region comprising an interleaved address space for relatively higher performance use cases and the linear region comprising a linear address space for relatively lower power use cases; receiving memory requests from one or more clients, the memory requests comprising a preference for power savings or performance; and assigning the memory requests to the linear region or the interleaved region according to the preference for power savings or performance.

Another embodiment is a system for providing memory channel interleaving with selective power or performance optimization. One such system comprises a System on Chip (SOC), a memory address map, and a memory channel interleaver. The SoC comprises one or more processing units for generating memory requests for access to two or more external memory devices connected to the SoC and accessed via two or more respective memory channels. The memory requests comprise a preference for power savings or performance. The memory address map is associated with the external memory devices and comprises an interleaved region and a linear region. The interleaved region comprises an interleaved address space for relatively higher performance use cases. The linear region comprises a linear address space for relatively lower power use cases. The memory channel interleaver resides on the SoC and is configured to assign the memory requests to the linear region or the interleaved region according to the preference for power savings or performance.

BRIEF DESCRIPTION OF THE DRAWINGS

In the Figures, like reference numerals refer to like parts throughout the various views unless otherwise indicated. For reference numerals with letter character designations such as "102A" or "102B", the letter character designations may differentiate two like parts or elements present in the same Figure. Letter character designations for reference numerals may be omitted when it is intended that a reference numeral to encompass all parts having the same reference numeral in all Figures.

DETAILED DESCRIPTION

The word "exemplary" is used herein to mean "serving as an example, instance, or illustration." Any aspect described herein as "exemplary" is not necessarily to be construed as preferred or advantageous over other aspects.

In this description, the term "application" may also include files having executable content, such as: object code, scripts, byte code, markup language files, and patches. In addition, an "application" referred to herein, may also include files that are not executable in nature, such as documents that may need to be opened or other data files that need to be accessed.

The term "content" may also include files having executable content, such as: object code, scripts, byte code, markup language files, and patches. In addition, "content" referred to herein, may also include files that are not executable in nature, such as documents that may need to be opened or other data files that need to be accessed.

As used in this description, the terms "component," "database," "module," "system," and the like are intended to refer to a computer-related entity, either hardware, firmware, a combination of hardware and software, software, or software in execution. For example, a component may be, but is not limited to being, a process running on a processor, a processor, an object, an executable, a thread of execution, a program, and/or a computer. By way of illustration, both an application running on a computing device and the computing device may be a component. One or more components may reside within a process and/or thread of execution, and a component may be localized on one computer and/or distributed between two or more computers. In addition, these components may execute from various computer readable media having various data structures stored thereon. The components may communicate by way of local and/or remote processes such as in accordance with a signal having one or more data packets (e.g., data from one component interacting with another component in a local system, distributed system, and/or across a network such as the Internet with other systems by way of the signal).

In this description, the terms "communication device," "wireless device," "wireless telephone", "wireless communication device," and "wireless handset" are used interchangeably. With the advent of third generation ("3G") and fourth generation ("4G") wireless technology, greater bandwidth availability has enabled more portable computing devices with a greater variety of wireless capabilities. Therefore, a portable computing device may include a cellular telephone, a pager, a PDA, a smartphone, a navigation device, or a hand-held computer with a wireless connection or link.

Figure 1:
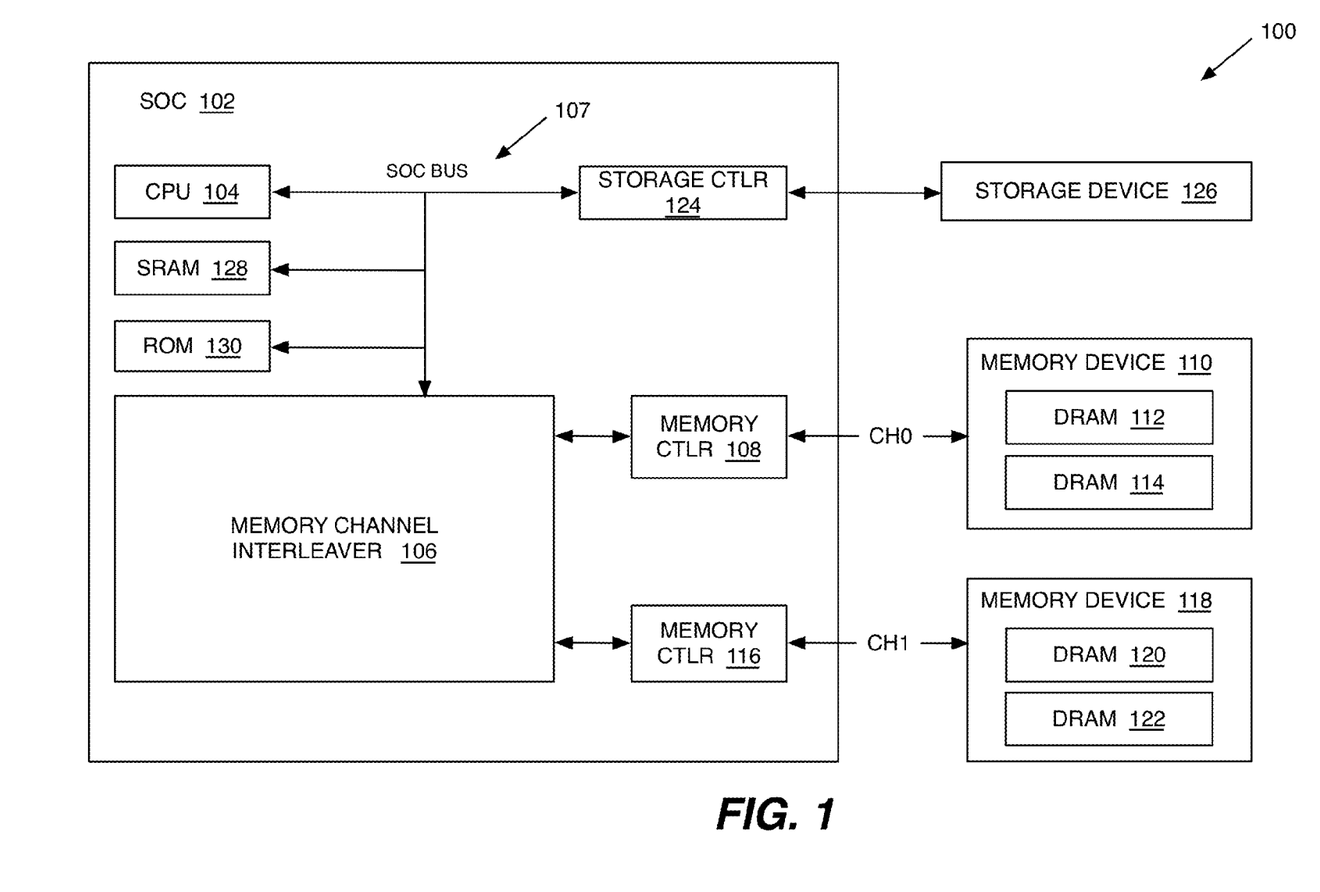
FIG. 1 is a block diagram of an embodiment of system for providing memory channel interleaving with selective power or performance optimization.

FIG. 1 illustrates a system 100 for providing memory channel interleaving with selective performance or power optimization. The system 100 may be implemented in any computing device, including a personal computer, a workstation, a server, a portable computing device (PCD), such as a cellular telephone, a portable digital assistant (PDA), a portable game console, a palmtop computer, or a tablet computer.

As illustrated in the embodiment of FIG. 1, the system 100 comprises a System on Chip (SoC) 102 comprising various on-chip components and various external components connected to the SoC 102. The SoC 102 comprises one or more processing units, a memory channel interleaver 106, a storage controller 124, and on-board memory (e.g., a static random access memory (SRAM) 128, read only memory (ROM) 130, etc.) interconnected by a SoC bus 107. The storage controller 124 is electrically connected to and communicates with an external storage device 126. As known in the art, the memory channel interleaver 106 receives read/write memory requests associated with the CPU 104 (or other memory clients) and distributes the memory data between two or more memory controllers, which are connected to respective external memory devices via a dedicated memory channel. In the example of FIG. 1, the system 100 comprises two memory devices 110 and 118. The memory device 110 is connected to the memory controller 108 and communicates via a first memory channel (CH0). The memory device 118 is connected to the memory controller 116 and communicates via a second memory channel (CH1).

It should be appreciated that any number of memory devices, memory controllers, and memory channels may be used in the system 100 with any desirable types, sizes, and configurations of memory (e.g., double data rate (DDR) memory). In the embodiment of FIG. 1, the memory device 110 supported via channel CH0 comprises two dynamic random access memory (DRAM) devices: a DRAM 112 and a DRAM 114. The memory device 118 supported via channel CH1 also comprises two DRAM devices: a DRAM 120 and a DRAM 122.

Figure 3:
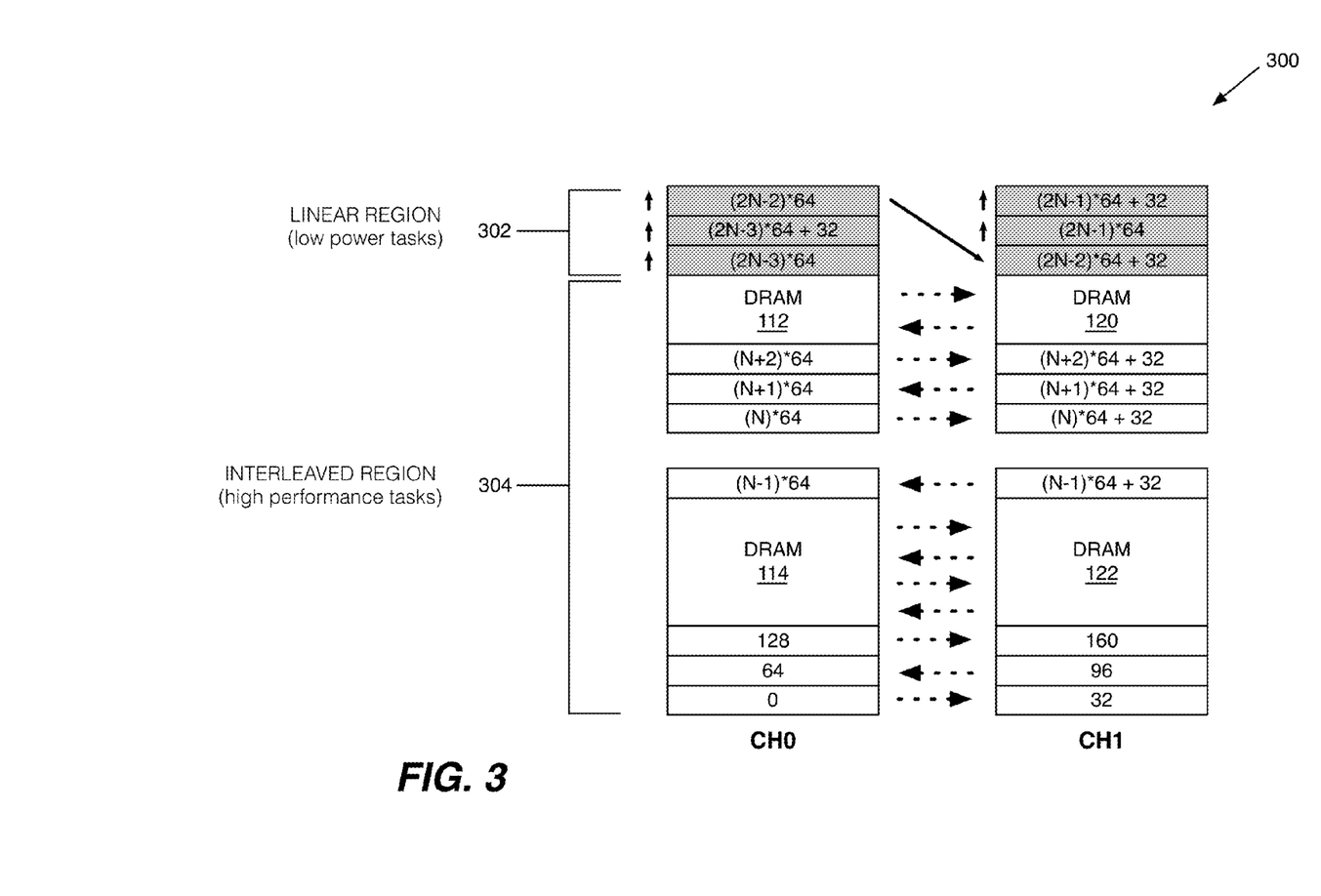
FIG. 3 is data/flow diagram illustrating the structure and operation of an exemplary memory address map in the system of FIG. 1.

The memory channel interleaver 106 comprises a specially configured memory channel interleaver for selectively providing performance and power savings optimization. The memory channel interleaver 106 is configured to selectively provide both high performance (interleaved) and low performance (linear) memory regions. FIG. 3 illustrates an exemplary memory address map 300 controlled by the memory channel interleaver 106. The memory address map 300 will be described to illustrate the general operation, architecture, and functionality of the system 100 and the memory channel interleaver 106. The memory address map 300 corresponds to the exemplary system 100 illustrated in FIG. 1 with the memory device 110 comprising DRAMs 112 and 114 (accessed via memory channel CH0) and the memory device 118 comprising DRAMs 120 and 122 (accessed via memory channel CH1).

The memory address map 300 comprises a linear region 302 and an interleaved region 304. The linear region 302 may be used for relatively low power use cases and/or tasks, and the interleaved region 304 may be used for relatively high performance use cases and/or tasks. Each region comprises a separate allocated memory address space with a corresponding address range divided between the two memory channels CH0 and CH1. The interleaved region 304 comprises an interleaved address space, and the linear region 302 comprises a linear address space.

Referring to the example of FIG. 3 and regarding the interleaved address space, a first address (address 0) may be assigned to a lower address associated with DRAM 114 and memory channel CH0. The next address in the interleaved address range (address 32) may be assigned to a lower address associated with DRAM 122 and memory channel CH1. In this manner, a pattern of alternating addresses may be "striped" or interleaved across memory channels CH0 and CH1, ascending to top or last addresses associated with DRAM 112 and DRAM 112, which define a boundary between the interleaved region 304 and the linear region 302. In the interleaved region 304, the horizontal dashed arrows between channels CH0 and CH1 illustrate how the addresses "ping-pong" between the memory channels. Clients requesting memory resources (e.g., CPU 104) for reading/writing data to the memory devices may be serviced by both memory channels CH0 and CH1 because the data addresses may be assumed to be random and, therefore, may be uniformly distributed across both channels CH0 and CH1.

The linear region 302 comprises separate consecutive memory address ranges within the same channel. As illustrated in the embodiment of FIG. 3, a first range of consecutive memory addresses may be assigned to DRAM 112 in CH0, and a second range of consecutive addresses may be assigned to DRAM 120 in CH1. The next address in DRAM 112 above the interleaved/linear boundary may be assigned the first address $(2N-3)*64$ in the linear address space. The vertical arrows illustrate that the consecutive addresses are assigned within CH0 until a top or last address in DRAM 112 is reached (address $(2N-2*64)$). When the last available address in CH0 is reached, the next address in the linear address space may be assigned to the next available address in DRAM 120 above the interleaved/linear boundary (address $(2N-2)*64+32$). Then, the allocation scheme follows the consecutive memory addresses in CH1 until a top address is reached (address $(2N-1)*64+32$).

In this manner, it should be appreciated that low performance use case data may be contained completely in either channel CH0 or channel CH1. In operation, only one of the channels CH0 and CH1 may be active while the other channel is placed in an inactive or "self-refresh" mode to conserve memory power. This can be extended to any number N memory channels.

Figure 2:
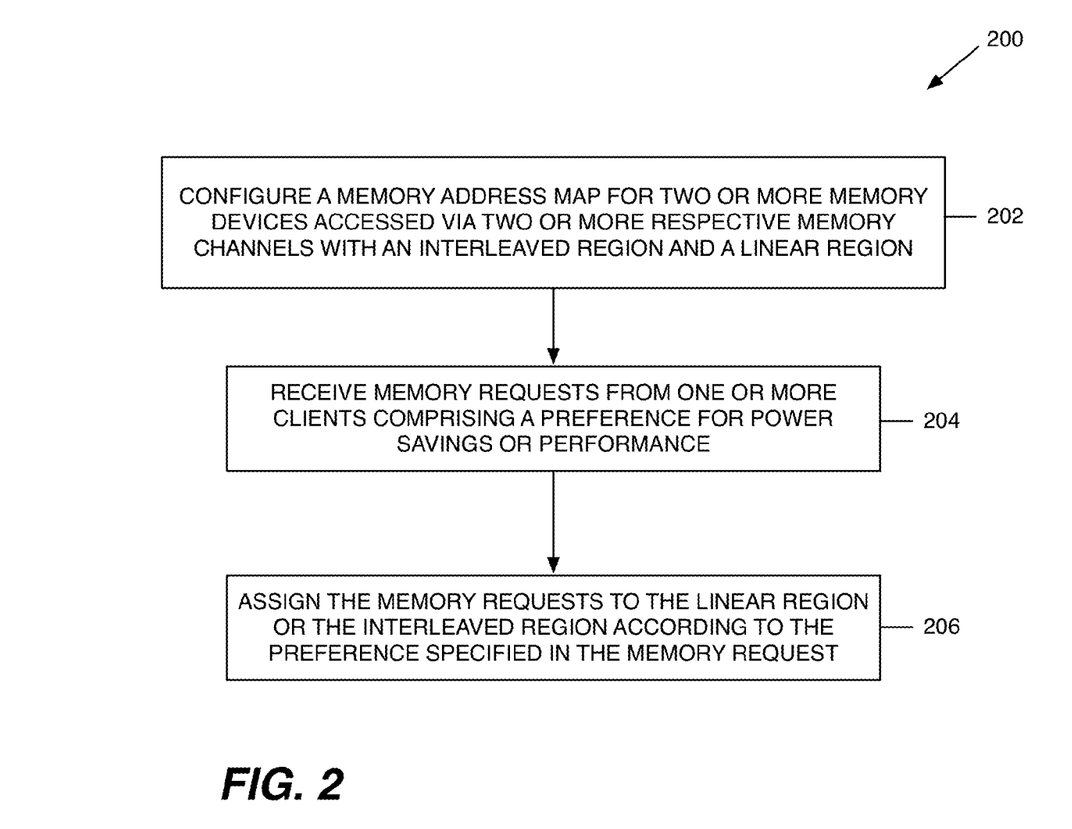
FIG. 2 is a flowchart illustrating an embodiment of a method implemented in the system of FIG. 1 for providing memory channel interleaving with selective power or performance optimization.

FIG. 2 illustrates a method 200 implemented by the system 100 (FIG. 1) for providing memory channel interleaving with selective performance or power optimization. At block 202, a memory address map 300 is configured for the available memory devices (e.g., DRAMs 112, 114, 120, and 122) accessed via two or more memory channels (e.g., memory channels CH0 and CH1) with an interleaved region 304 and a linear region 302. The memory address map 300 may be configured based on the expected memory footprint or size high and low performance use cases. At boot, based on the platform profile, the memory channel interleaver 106 may provide a predetermined amount of interleaved and linear memory space. At runtime, an operating system may allocate the interleaved region 304 for high performance client requests, such as, the graphics processing unit (GPU), the display, multimedia resources, camera, etc. The operating system may allocate linear memory for relatively lower performance and/or all other client requests. For example, the linear region 302 may be allocated for operating system resources, general low performance applications, services, etc. It should be appreciated that the memory may be dynamically allocated for the GPU to the interleaved region 304. In other embodiments, referred to as static allocation, the GPU may use memory which has been predetermined, for example, at boot to use the interleaved region 304 in order to achieve high performance.

In an embodiment, the memory allocation for the linear region 302 and the interleave region 304 may be configured based on desirable use cases. The memory allocation on different linear regions may be grouped based on use cases. For example, a first "power savings" use case may be permitted to access a first linear address space associated with CH0, and a second "power savings" use case may be permitted to access a second linear address space associated with CH1. In this manner, memory power saving can be realized on one memory channel while the other is active.

Referring again to FIG. 2, at block 204, the memory channel interleaver 106 may receive memory requests from one or more clients (e.g., CPU 104) requesting memory resources. A memory request may include a "hint", parameter(s), or other data indicating a preference for power savings or performance. In an embodiment, the power/performance preference may be specified via a system call to an operating system. In this regard, the system 100 may include an operating system (not shown) that provides support for memory allocation. The operating system may have the capability to allocate memory from specific heaps as indicated by a caller. The memory channel interleaver 106 and the system 100 provide the ability to specify a memory type (i.e., interleaved versus. linear) according to, for example, a degree of preference for power savings versus performance and, thereby, achieve memory power savings and/or high bandwidth throughput.

For example, non-uniform memory access (NUMA), which is used in multiprocessing, may perform memory allocation based on memory nodes relative to a processor (e.g., CPU 104). Under NUMA, a processor has information of the performance difference of different memory nodes, and may be able to intelligently allocate memory from preferred nodes. System 100 may implement this mechanism to allocate memory from a list of available nodes with intelligence to allocate the memory from the node that yields the best performance or based on power consumption characteristics. Furthermore, in some operating systems (e.g., Linux Android®), the memory allocator may have an input argument to indicate one or more memory heaps to allocate from, with the fallback ordered according to which memory heap was first added via calls during boot. The memory channel interleaver 106 may support such a mechanism to allocate the memory from a specific heap type based on either performance or power consumption as requested by the clients.

At block 206, the memory channel interleaver 106 assigns the received memory requests to the linear region 302 or the interleaved region 304 according to the preference specified in the memory request (or otherwise) and the memory address map 300.

Figure 5:
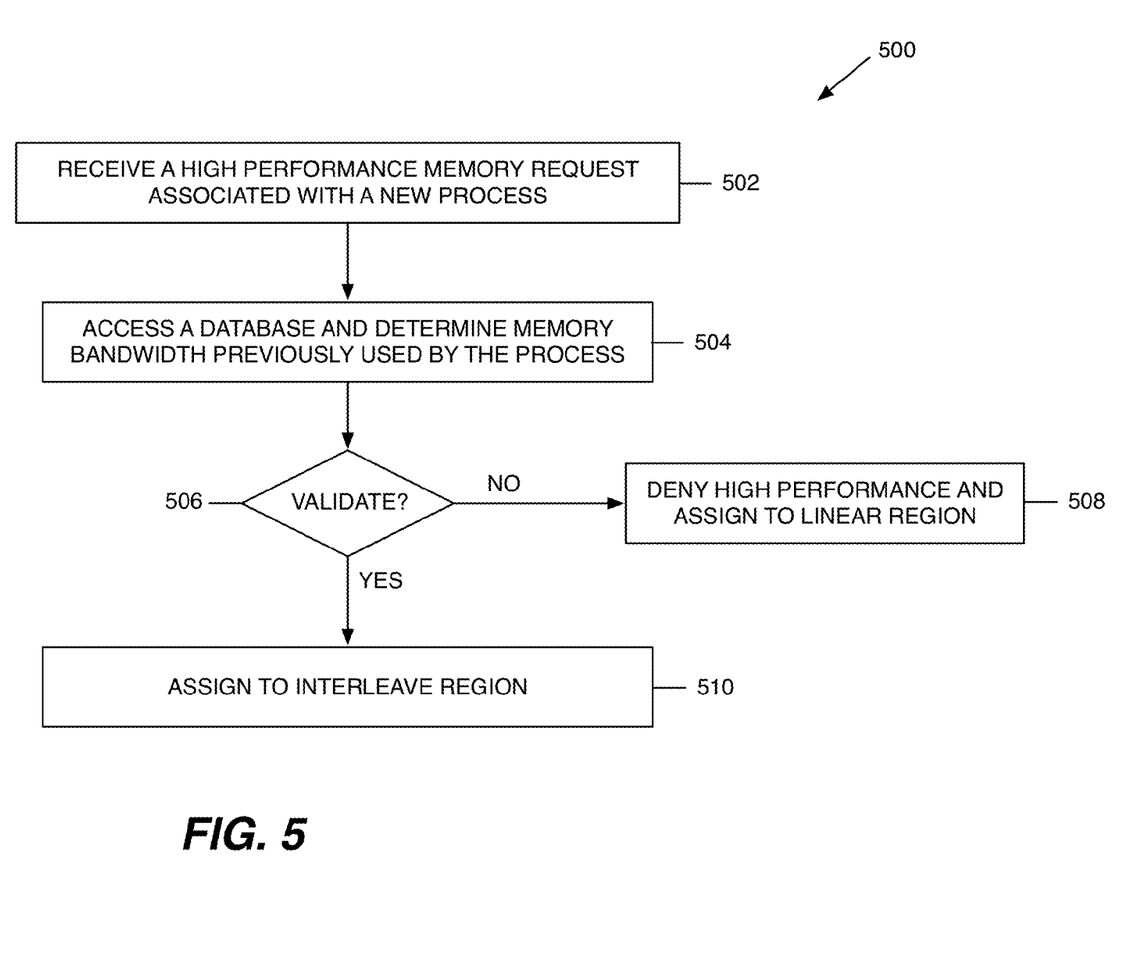
FIG. 5 is a flowchart illustrating an embodiment of a method for validating or overriding high performance memory requests.

As illustrated in the method 500 of FIG. 5, the memory channel interleaver 106 may also provide a mechanism for validating high performance memory requests against a database comprising a historical log of memory bandwidth usage for specific types of tasks, processes, etc. At block 502, the memory channel interleaver 106 may receive a high performance memory request associated with a new process. At block 504, the historical log may be accessed to determine the memory bandwidth previously used by the process.

In this manner, the memory requests may be allocated according to a historical tracking of bandwidth demand for each running task. In an embodiment, transaction counters may be used for logging the demand bandwidth for each of the running tasks on the system 100 and accumulating a history for each process name, which may be stored in a file system or other memory. A memory manager may access the database when allocating memory to new tasks. As described above, the task may provide a hint that it is high performance or low performance. The task may also specify whether the buffer is shareable. The memory manager may access the database to validate the request. If high performance has not been empirically logged and justified, the memory allocator may deny the hint and only allocate low performance memory to save power. The memory allocator may also look at whether the buffer was declared as shareable and adheres to the original hint if it is shareable because a different task using the same shared buffer may require high bandwidth.

Referring again to FIG. 5, at decision block 506, the memory channel interleaver 106 determines if the high performance memory request is validated. If the previous bandwidth does not meet a predetermined threshold for assigning to the interleaved region 304, the memory request may be denied and instead assigned to the linear region 302 (block 508). If the high performance memory request is validated, however, the memory request may be assigned to the interleaved region (block 510).

Figure 4:
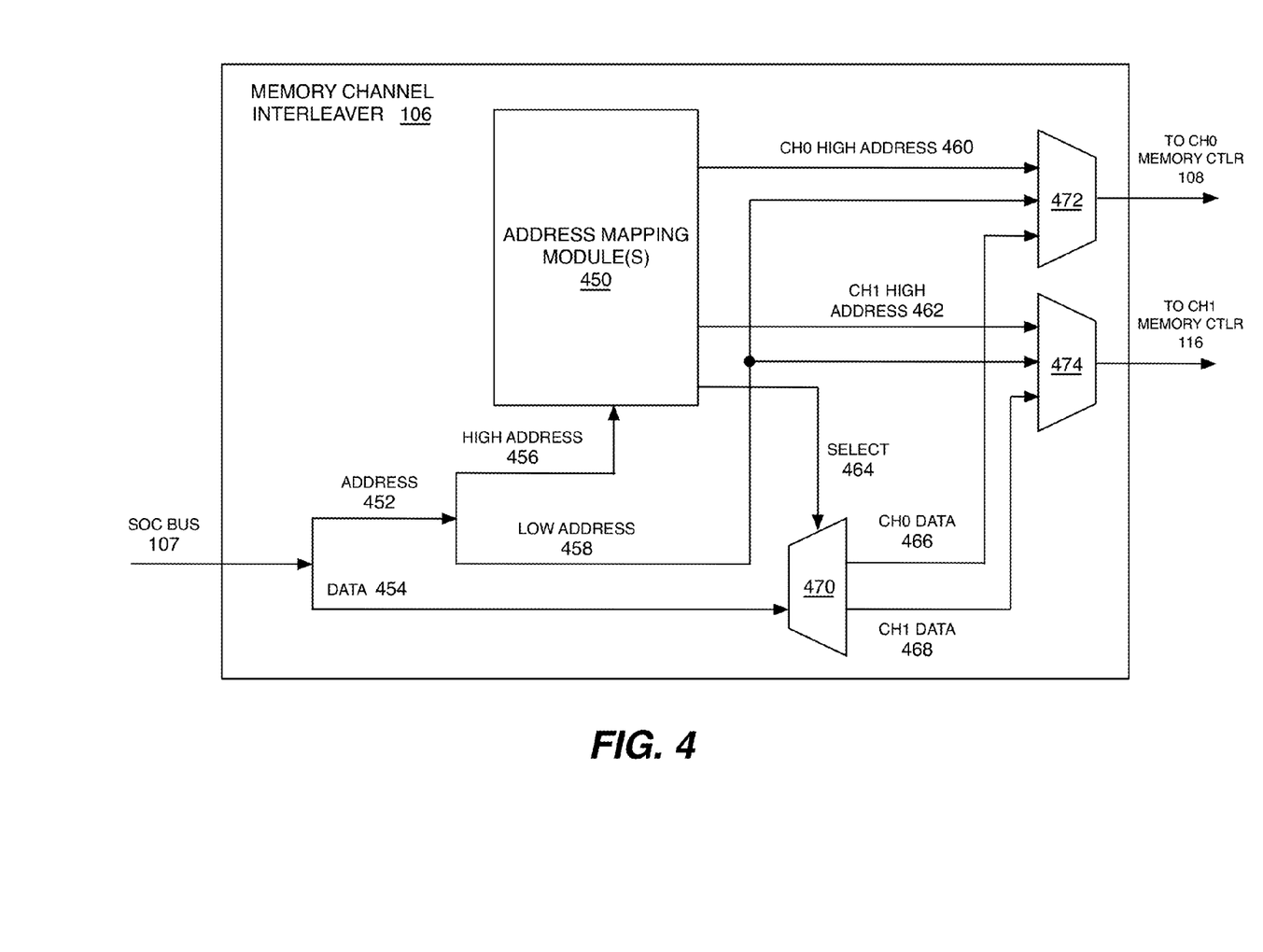
FIG. 4 is a block/flow diagram illustrating an embodiment of the memory channel interleaver of FIG. 1.

FIG. 4 is a schematic/flow diagram illustrating the architecture, operation, and/or functionality of an embodiment of the memory channel interleaver 106. The memory channel interleaver 106 receives input on the SoC bus 107 and provides outputs to memory controllers 108 and 116 (memory channels CH0 and CH1, respectively) via separate memory controller buses. The memory controller buses may run at half the rate of the SoC bus 107 with the net data throughput being matched. Address mapping module(s) 450 may be programmed via the SoC bus 107. The address mapping module(s) 450 may configure and access the address memory map 300, as described above, with the linear region 302 and the interleaved region 304. Data traffic entering on the SoC bus 107 is routed to a data selector 470, which forwards the data to memory controllers 108 and 116 via merge components 472 and 474, respectively, based on a select signal 464 provided by the address mapping module(s) 450. For each traffic packet, a high address 456 enters the address mapping module(s) 450. The address mapping module(s) 450 compares the high address 456 against pre-programmed linear and interleaved region addresses, performs address bit position re-ordering, and then outputs it to a CH0 high address 460 or CH1 high address 462 based on interleave parameters. The select signal 464 specifies whether CH0 or CH1 has been selected.

The merge components 472 and 474 may comprise a recombining of the high addresses 460 and 462, low address 405, and the CH0 data 466 and the CH1 data 468.

Figure 6:
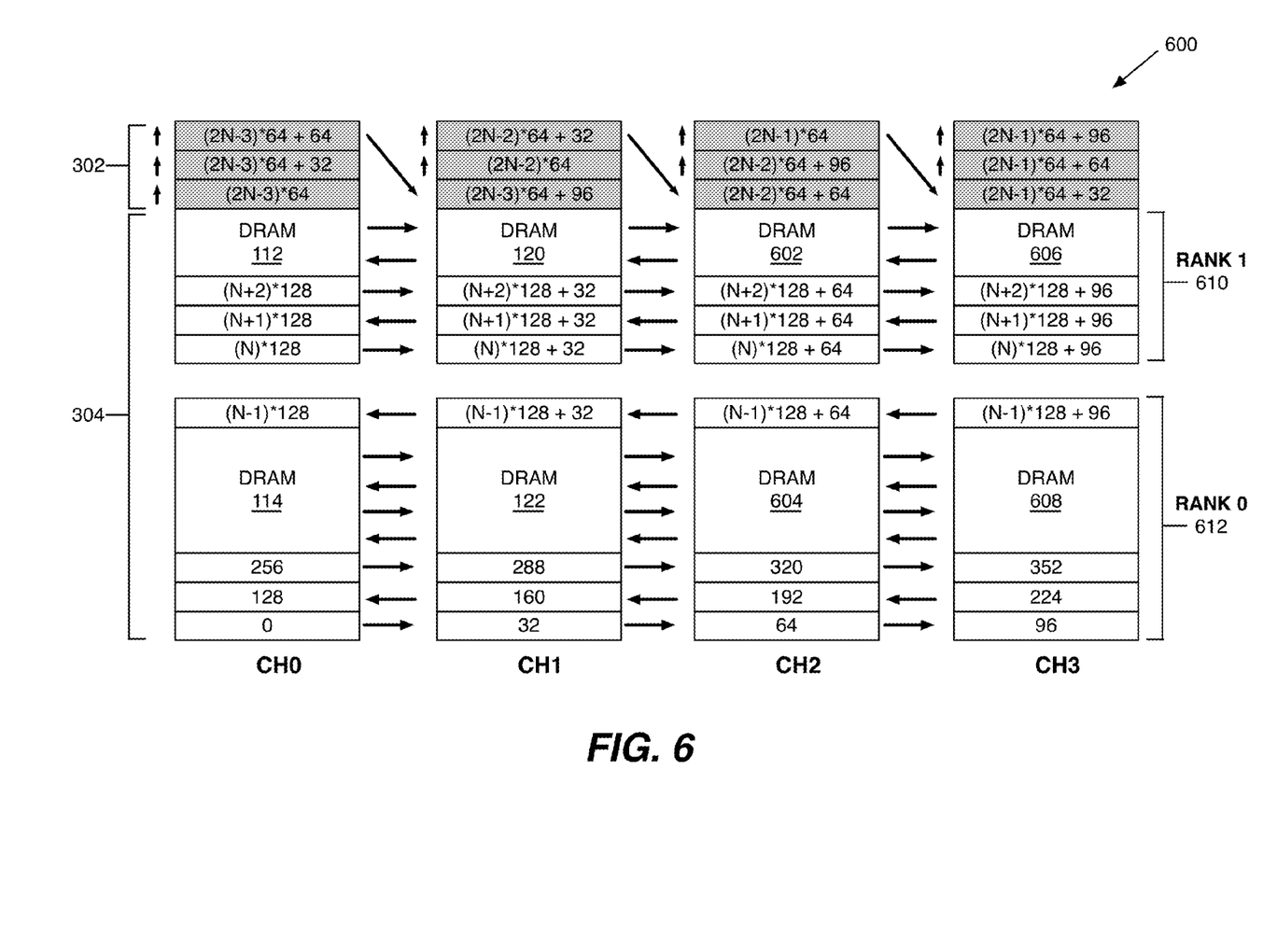
FIG. 6 illustrates another embodiment of a memory address map with a linear region and an interleaved region using four memory channels and two ranks.

FIG. 6 illustrates another embodiment of a memory address map 600 adapted for four memory channels and using a plurality of ranks Memory address map 600 adds two additional memory channels CH2 and CH3, as compared to memory address map 300 (FIG. 3) discussed above. Memory channel CH2 is associated with additional DRAMs 602 and 604. Memory channel CH3 is associated with additional DRAMs 606 and 608. As illustrated in FIG. 6, the memory address map 600 provides a ranking scheme (rank 1 and rank 0), each with customized interleave settings to provide a desired balance between performance and power consumption. The linear region 302 may be in rank 1 and use, for example, a Bank-Row-Column (BRC) DRAM interleave mechanism for providing power savings. A first portion 610 of the interleaved region 304 (which resides on DRAMs 112, 120, 602, and 606) may also be in rank 1 and use a Row-Bank-Column DRAM interleave mechanism for performance. A second portion 612 of the interleaved region 304 (which encompasses the entire memory available on DRAMs 114, 122, 604, and 608) may be in a different rank (i.e., rank 0). DRAMs 114, 122, 604, and 608 may enter in rank 0 using the RBC DRAM interleave mechanism for performance.

Figure 7:
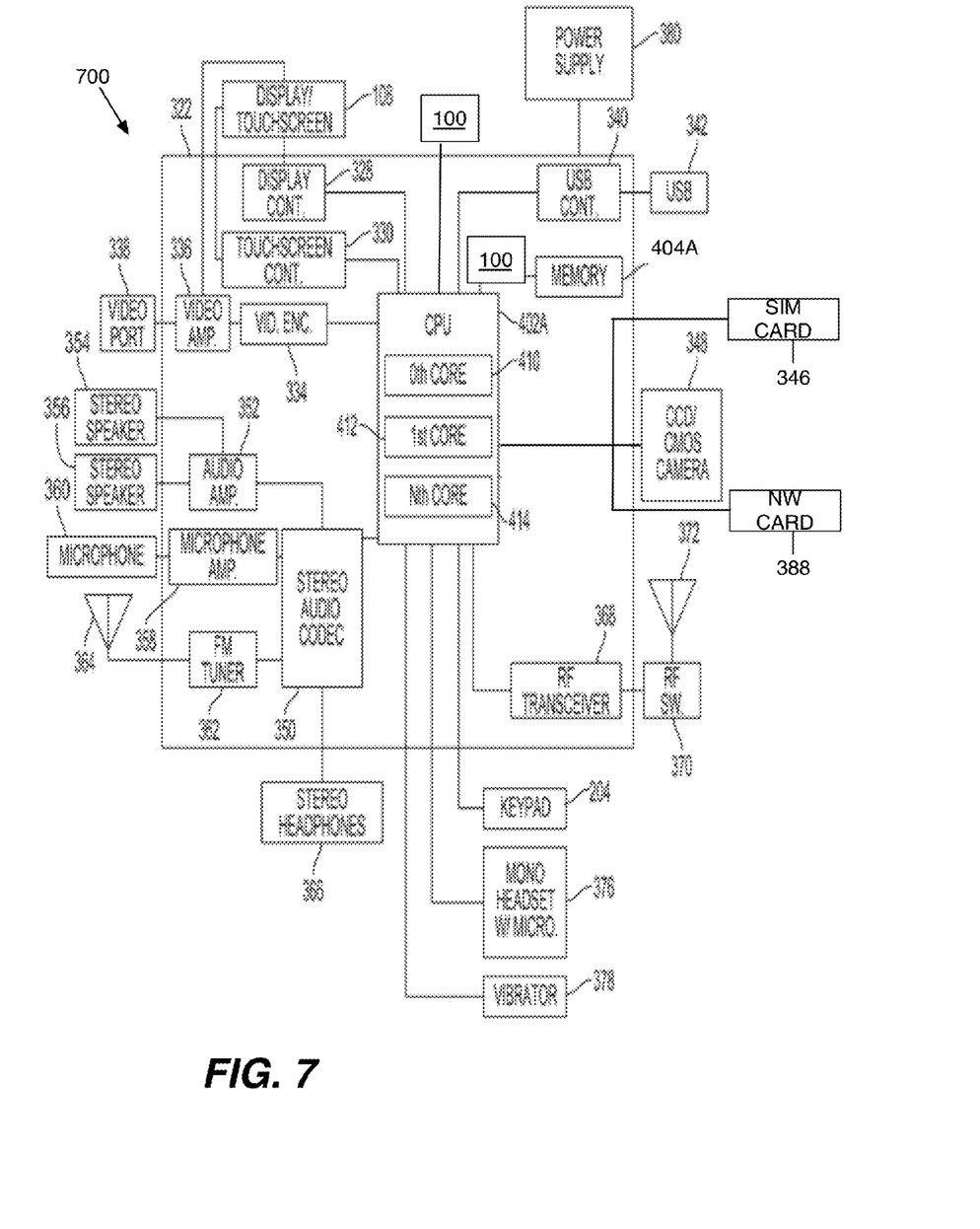
FIG. 7 is a block diagram of an embodiment of a portable computer device comprising the system of FIG. 1.

As mentioned above, the system 100 may be incorporated into any desirable computing system. FIG. 7 illustrates the system 100 incorporated in an exemplary portable computing device (PCD) 700. The system 100 may be included on the SoC 322, which may include a multicore CPU 402A. The multicore CPU 402A may include a zeroth core 410, a first core 412, and an Nth core 414. One of the cores may comprise, for example, a graphics processing unit (GPU) with one or more of the others comprising the CPU 104 (FIG. 1). According to alternate exemplary embodiments, the CPU 402a may also comprise those of single core types and not one which has multiple cores, in which case the CPU 104 and the GPU may be dedicated processors, as illustrated in system 100.

A display controller 328 and a touch screen controller 330 may be coupled to the CPU 402a. In turn, the touch screen display 108 external to the on-chip system 322 may be coupled to the display controller 328 and the touch screen controller 330.

FIG. 7 further shows that a video encoder 334, e.g., a phase alternating line (PAL) encoder, a sequential color a memoire (SECAM) encoder, or a national television system(s) committee (NTSC) encoder, is coupled to the multicore CPU 402A. Further, a video amplifier 336 is coupled to the video encoder 334 and the touch screen display 108. Also, a video port 338 is coupled to the video amplifier 336. As shown in FIG. 7, a universal serial bus (USB) controller 340 is coupled to the multicore CPU 402A. Also, a USB port 342 is coupled to the USB controller 340. Memory 404A and a subscriber identity module (SIM) card 346 may also be coupled to the multicore CPU 402A. Memory 404A may comprise memory devices 110 and 118 (FIG. 1), as described above. The system 100 (FIG. 1) may be coupled to the CPU 402A.

Further, as shown in FIG. 7, a digital camera 348 may be coupled to the multicore CPU 402A. In an exemplary aspect, the digital camera 348 is a charge-coupled device (CCD) camera or a complementary metal-oxide semiconductor (CMOS) camera.

As further illustrated in FIG. 7, a stereo audio coder-decoder (CODEC) 350 may be coupled to the multicore CPU 402A. Moreover, an audio amplifier 352 may coupled to the stereo audio CODEC 350. In an exemplary aspect, a first stereo speaker 354 and a second stereo speaker 356 are coupled to the audio amplifier 352. FIG. 7 shows that a microphone amplifier 358 may be also coupled to the stereo audio CODEC 350. Additionally, a microphone 360 may be coupled to the microphone amplifier 358. In a particular aspect, a frequency modulation (FM) radio tuner 362 may be coupled to the stereo audio CODEC 350. Also, an FM antenna 364 is coupled to the FM radio tuner 362. Further, stereo headphones 366 may be coupled to the stereo audio CODEC 350.

FIG. 7 further illustrates that a radio frequency (RF) transceiver 368 may be coupled to the multicore CPU 402A. An RF switch 370 may be coupled to the RF transceiver 368 and an RF antenna 372. As shown in FIG. 7, a keypad 204 may be coupled to the multicore CPU 402A. Also, a mono headset with a microphone 376 may be coupled to the multicore CPU 402A. Further, a vibrator device 378 may be coupled to the multicore CPU 402A.

FIG. 7 also shows that a power supply 380 may be coupled to the on-chip system 322. In a particular aspect, the power supply 380 is a direct current (DC) power supply that provides power to the various components of the PCD 700 that require power. Further, in a particular aspect, the power supply is a rechargeable DC battery or a DC power supply that is derived from an alternating current (AC) to DC transformer that is connected to an AC power source.

FIG. 7 further indicates that the PCD 700 may also include a network card 388 that may be used to access a data network, e.g., a local area network, a personal area network, or any other network. The network card 388 may be a Bluetooth network card, a WiFi network card, a personal area network (PAN) card, a personal area network ultra-low-power technology (PeANUT) network card, a television/cable/satellite tuner, or any other network card well known in the art. Further, the network card 388 may be incorporated into a chip, i.e., the network card 388 may be a full solution in a chip, and may not be a separate network card 388.

As depicted in FIG. 7, the touch screen display 108, the video port 338, the USB port 342, the camera 348, the first stereo speaker 354, the second stereo speaker 356, the microphone 360, the FM antenna 364, the stereo headphones 366, the RF switch 370, the RF antenna 372, the keypad 374, the mono headset 376, the vibrator 378, and the power supply 380 may be external to the on-chip system 322.

It should be appreciated that one or more of the method steps described herein may be stored in the memory as computer program instructions, such as the modules described above. These instructions may be executed by any suitable processor in combination or in concert with the corresponding module to perform the methods described herein.

Certain steps in the processes or process flows described in this specification naturally precede others for the invention to function as described. However, the invention is not limited to the order of the steps described if such order or sequence does not alter the functionality of the invention. That is, it is recognized that some steps may performed before, after, or parallel (substantially simultaneously with) other steps without departing from the scope and spirit of the invention. In some instances, certain steps may be omitted or not performed without departing from the invention. Further, words such as "thereafter", "then", "next", etc. are not intended to limit the order of the steps. These words are simply used to guide the reader through the description of the exemplary method.

Additionally, one of ordinary skill in programming is able to write computer code or identify appropriate hardware and/or circuits to implement the disclosed invention without difficulty based on the flow charts and associated description in this specification, for example.

Therefore, disclosure of a particular set of program code instructions or detailed hardware devices is not considered necessary for an adequate understanding of how to make and use the invention. The inventive functionality of the claimed computer implemented processes is explained in more detail in the above description and in conjunction with the Figures which may illustrate various process flows.

In one or more exemplary aspects, the functions described may be implemented in hardware, software, firmware, or any combination thereof. If implemented in software, the functions may be stored on or transmitted as one or more instructions or code on a computer-readable medium. Computer-readable media include both computer storage media and communication media including any medium that facilitates transfer of a computer program from one place to another. A storage media may be any available media that may be accessed by a computer. By way of example, and not limitation, such computer-readable media may comprise RAM, ROM, EEPROM, NAND flash, NOR flash, M-RAM, P-RAM, R-RAM, CD-ROM or other optical disk storage, magnetic disk storage or other magnetic storage devices, or any other medium that may be used to carry or store desired program code in the form of instructions or data structures and that may be accessed by a computer.

Also, any connection is properly termed a computer-readable medium. For example, if the software is transmitted from a website, server, or other remote source using a coaxial cable, fiber optic cable, twisted pair, digital subscriber line ("DSL"), or wireless technologies such as infrared, radio, and microwave, then the coaxial cable, fiber optic cable, twisted pair, DSL, or wireless technologies such as infrared, radio, and microwave are included in the definition of medium.

Disk and disc, as used herein, includes compact disc ("CD"), laser disc, optical disc, digital versatile disc ("DVD"), floppy disk and blu-ray disc where disks usually reproduce data magnetically, while discs reproduce data optically with lasers. Combinations of the above should also be included within the scope of computer-readable media.

Alternative embodiments will become apparent to one of ordinary skill in the art to which the invention pertains without departing from its spirit and scope. Therefore, although selected aspects have been illustrated and described in detail, it will be understood that various substitutions and alterations may be made therein without departing from the spirit and scope of the present invention, as defined by the following claims.

What is claimed is:

1. A memory channel interleaving method with selective power or performance optimization, the method comprising:
    configuring a memory address map for at least a first memory device and a second memory device, the first memory device associated with a first memory controller and a first memory channel, the second memory device associated with a second memory controller and a second memory channel, wherein each of the first and second memory devices comprises a portion of an interleaved region and a portion of a linear region, the interleaved region comprising an interleaved address space for relatively higher performance use cases and the linear region comprising a linear address space for relatively lower power use cases;
    receiving, at a memory channel interleaver, memory requests from one or more clients, the memory requests comprising a preference for power savings or performance; and
    assigning, by the memory channel interleaver, the memory requests comprising a preference for power savings to the linear region and the memory requests comprising a preference for performance to the interleaved region, wherein assigning the memory requests comprising a preference for power savings to the linear region comprises instructing the first memory controller to write to a first address range corresponding to the portion of the linear region within the first memory device and instructing the second memory controller to transition the second memory device into a power saving mode.

2. The method of claim 1, further comprising when a last memory address in the first address range corresponding to the portion of the linear region within the first memory device is reached:
    placing the first memory device in the power saving mode;
    activating the second memory device; and
    writing a next received memory request comprising a preference for power savings to a second address range corresponding to the portion of the linear region within the second memory device.

3. The method of claim 1, wherein the preference for power savings or performance is specified via a system call to an operating system.

4. The method of claim 1, wherein the preference for power savings or performance comprises a parameter specifying a type of memory heap.

5. The method of claim 1, wherein the memory devices comprise dynamic random access memory (DRAM) devices.

6. The method of claim 1, wherein the memory channel interleaver receives the memory requests via a System on Chip (SOC) bus.

7. The method of claim 1, further comprising:
    validating, at the memory channel interleaver, memory requests having the preference for performance against a database comprising a historical log of memory bandwidth; and
    if not validated, overriding, at the memory channel interleaver, the preference for performance and assigning the unvalidated memory request to the linear region.

8. The method of claim 1, wherein the assigning the memory requests to the linear region or the interleaved region comprises dynamic memory allocation or predetermined static memory allocation.

9. The method of claim 1, wherein the memory channel interleaver comprises an address mapping module.

10. The method of claim 9, wherein the memory channel interleaver further comprises a data selector, the data selector being coupled to and communicating with the address mapping module.

11. A system for providing memory channel interleaving with selective power or performance optimization, the system comprising:
    means for configuring a memory address map for at least a first memory device and a second memory device, the first memory device associated with a first memory controller and a first memory channel, the second memory device associated with a second memory controller and a second memory channel, wherein each of the first and second memory devices comprises a portion of an interleaved region and a portion of a linear region, the interleaved region comprising an interleaved address space for relatively higher performance use cases and the linear region comprising a linear address space for relatively lower power use cases;

means for receiving memory requests from one or more clients, the memory requests comprising a preference for power savings or performance; and means for assigning the memory requests comprising a preference for power savings to the linear region and the memory requests comprising a preference for performance to the interleaved region, wherein means for assigning the memory requests comprising a preference for power savings to the linear region comprises means for instructing the first memory controller to write to a first address range corresponding to the portion of the linear region within the first memory device and means for instructing the second memory controller to transition the second memory device into a power saving mode.

12. The system of claim 11, further comprising when a last memory address in the first address range corresponding to the portion of the linear region within the first memory device is reached:

means for placing the first memory device in the power saving mode;

means for activating the second memory device; and means for writing a next received memory request comprising a preference for power savings to a second address range corresponding to the portion of the linear region within the second memory device.

13. The system of claim 11, wherein the preference for power savings or performance is specified via a system call to an operating system.

14. The system of claim 11, wherein the preference for power savings or performance comprises a parameter specifying a type of memory heap.

15. The system of claim 11, wherein the memory devices comprise dynamic random access memory (DRAM) devices.

16. The system of claim 11, wherein the means for receiving the memory requests is in communication with a System on Chip (SOC) bus.

17. The system of claim 11, further comprising:

means for validating memory requests having the preference for performance against a database comprising a historical log of memory bandwidth; and means for overriding the preference for performance for unvalidated memory requests and assigning the unvalidated memory requests to the linear region.

18. The system of claim 11, wherein the means for assigning the memory requests to the linear region or the interleaved region comprises a dynamic memory allocation means or a predetermined static memory allocation means.

19. The system of claim 11, wherein the means for assigning the memory requests comprises a memory channel interleaver having an address mapping module.

20. The system of claim 19, wherein the memory channel interleaver further comprises a data selector, the data selector being coupled to and communicating with the address mapping module.

21. A computer program product comprising a non-transitory computer usable medium having a computer readable program code embodied therein, the computer readable program code adapted to be executed to implement a method for memory channel interleaving with selective power or performance optimization, the method comprising:

configuring a memory address map for at least a first memory device and a second memory device, the first memory device associated with a first memory controller and a first memory channel, the second memory device associated with a second memory controller and a second memory channel, wherein each of the first and second memory devices comprises a portion of an interleaved region and a portion of a linear region, the interleaved region comprising an interleaved address space for relatively higher performance use cases and the linear region comprising a linear address space for relatively lower power use cases;

receiving memory requests from one or more clients, the memory requests comprising a preference for power savings or performance; and assigning the memory requests comprising a preference for power savings to the linear region and the memory requests comprising a preference for performance to the interleaved region, wherein assigning the memory requests comprising a preference for power savings to the linear region comprises instructing the first memory controller to write to a first address range corresponding to the portion of the linear region within the first memory device and instructing the second memory controller to transition the second memory device into a power saving mode.

22. The computer program product of claim 21, wherein the method further comprises when a last memory address in the first address range corresponding to the portion of the linear region within the first memory device is reached:

placing the first memory device in the power saving mode;

activating the second memory device; and writing a next received memory request comprising a preference for power savings to a second address range corresponding to the portion of the linear region within the second memory device.

23. The computer program product of claim 21, wherein the preference for power savings or performance is specified via a system call to an operating system.

24. The computer program product of claim 21, wherein the preference for power savings or performance comprises a parameter specifying a type of memory heap.

25. The computer program product of claim 21, wherein the memory devices comprise dynamic random access memory (DRAM) devices.

26. The computer program product of claim 21, wherein the memory channel interleaver receives the memory requests via a System on Chip (SOC) bus.

27. The computer program product of claim 21, wherein the method further comprises:

validating memory requests having the preference for performance against a database comprising a historical log of memory bandwidth; and if not validated, overriding the preference for performance and assigning the unvalidated memory request to the linear region.

28. The computer program product of claim 21, wherein the assigning the memory requests to the linear region or the interleaved region comprises dynamic memory allocation or predetermined static memory allocation.

29. The computer program product of claim 21, wherein assigning the memory requests is performed by a memory channel interleaver.

30. The computer program product of claim 29, wherein the memory channel interleaver comprises an address mapping module and a data selector, the data selector being coupled to and communicating with the address mapping module.

31. A system for providing memory channel interleaving with selective power or performance optimization, the system comprising:
a System on Chip (SOC) comprising one or more processing units for generating memory requests for access to at least a first memory device and a second memory device connected to the SoC, the first memory device associated with a first memory controller and a first memory channel, the second memory device associated with a second memory controller and a second memory channel, wherein:
each of the first and second memory devices comprises a portion of an interleaved region and a portion of a linear region defined by a memory address map, the interleaved region comprising an interleaved address space for relatively higher performance use cases and the linear region comprising a linear address space for relatively lower power use cases; and
a memory channel interleaver residing on the SoC and configured to:
receive memory requests from the one or more processing units, the memory requests comprising a preference for power savings or performance; and
assign the memory requests comprising a preference for power savings to the linear region and the memory requests comprising a preference for performance to the interleaved region, wherein assigning the memory requests comprising a preference for power savings to the linear region comprises instructing the first memory controller to write to a first address range corresponding to the portion of the linear region within the first memory device and instructing the second memory controller to transition the second memory device into a power saving mode.

32. The system of claim 31, wherein when a last memory address in the first address range corresponding to the portion of the linear region within the first memory device is reached:
the first memory device is placed in the power saving mode;
the second memory device is activated; and
a next received memory request comprising a preference for power savings is written to a second address range corresponding to the portion of the linear region within the second memory device.

33. The system of claim 31, wherein the preference for power savings or performance is specified via a system call to an operating system.

34. The system of claim 31, wherein the preference for power savings or performance comprises a parameter specifying a type of memory heap.

35. The system of claim 31, wherein the memory devices comprise dynamic random access memory (DRAM) devices.

36. The system of claim 31, wherein the SOC resides on a portable communications device.

37. The system of claim 31, wherein the memory channel interleaver is further configured to:
validate memory requests having the preference for performance against a database comprising a historical log of memory bandwidth; and
if not validated, override the preference for performance and assign the unvalidated memory request to the linear region.

38. The system of claim 31, wherein the memory channel interleaver is further configured to assign the memory requests to the linear region or the interleaved region using dynamic memory allocation or predetermined static memory allocation.

39. The system of claim 31, wherein the memory channel interleaver comprises an address mapping module.

40. The system of claim 39, wherein the memory channel interleaver further comprises a data selector, the data selector being coupled to and communicating with the address mapping module.

* * * * *